US008001927B2

(12) United States Patent
Dorier et al.

(10) Patent No.: US 8,001,927 B2
(45) Date of Patent: Aug. 23, 2011

(54) PLASMA SPRAYING DEVICE AND A METHOD FOR INTRODUCING A LIQUID PRECURSOR INTO A PLASMA GAS STREAM

(75) Inventors: Jean-Luc Dorier, Bussigny-pres-Lausanne (CH); Christoph Hollenstein, Lutry (CH); Gérard Barbezat, Winterthur (CH); Arno Refke, Mellingen (CH)

(73) Assignee: Sulzer Metco AG, Wohlen (CH)

( * ) Notice: Subject to any disclaimer, the term of this patent is extended or adjusted under 35 U.S.C. 154(b) by 894 days.

(21) Appl. No.: 11/820,631

(22) Filed: Jun. 19, 2007

(65) Prior Publication Data

US 2008/0057212 A1 Mar. 6, 2008

(30) Foreign Application Priority Data

Aug. 30, 2006 (EP) .................................... 06119769

(51) Int. Cl.
*C23C 16/00* (2006.01)

(52) U.S. Cl. .................................................. 118/723 R

(58) Field of Classification Search .................. 118/715, 118/722, 723 R; 315/111.21
See application file for complete search history.

(56) References Cited

U.S. PATENT DOCUMENTS

| | | | |
|---|---|---|---|
| 3,596,128 | A | 7/1971 | Elliott |
| 4,035,684 | A | 7/1977 | Svoboda et al. |
| 6,447,848 | B1 | 9/2002 | Chow et al. |
| 6,800,336 | B1 | 10/2004 | Förnsel et al. |
| 2003/0077398 | A1 | 4/2003 | Strutt et al. |

FOREIGN PATENT DOCUMENTS

| | | | |
|---|---|---|---|
| AU | 537262 | B2 | 6/1984 |
| EP | 0297637 | A1 | 1/1989 |
| WO | WO 2006/043006 | A1 | 4/2006 |

*Primary Examiner* — Maureen Gramaglia
(74) *Attorney, Agent, or Firm* — Kilpatrick Townsend & Stockton LLP

(57) ABSTRACT

The invention relates to a plasma spraying device (1) for spraying a coating (2) onto a substrate (3) by a thermal spray process. Said plasma spraying device (1) includes a plasma torch (4) for heating up a plasma gas (5) in a heating zone (6), wherein the plasma torch (4) includes a nozzle body (7) for forming a plasma gas stream (8), and said plasma torch (4) has an aperture (9) running along a central longitudinal axis (10) through said nozzle body (7). The aperture (9) has an convergent section (11) with an inlet (12) for the plasma gas (5), a throat section (13) including a minimum cross-sectional area of the aperture, and a divergent section (14) with an outlet (15) for the plasma gas stream (8), wherein an introducing duct (16) is provided for introducing a liquid precursor (17) into the plasma gas stream (8). According to the invention a penetration means (18, 161, 181, 182) is provided to penetrate the liquid precursor (17) inside the plasma gas stream (8). The invention relates also to a method for introducing a liquid precursor (17) into a plasma gas stream (8) as well as to the use of a plasma spraying device (1) and a method in accordance with the present invention for coating a surface of a substrate (3).

17 Claims, 3 Drawing Sheets

PLASMA SPRAYING DEVICE AND A METHOD FOR INTRODUCING A LIQUID PRECURSOR INTO A PLASMA GAS STREAM

CROSS REFERENCE TO RELATED APPLICATIONS

This application claims the priority of European Patent Application No. 06119769, dated Aug. 30, 2006, the disclosure of which is incorporated herein by reference.

BACKGROUND OF THE INVENTION

The invention relates to a plasma spraying device for spraying a coating onto a substrate, as well as to a method for introducing a liquid precursor into a plasma gas stream, and the use of such a plasma spraying device and/or such a plasma spraying method for coating a substrate.

The plasma torch is one of the most rugged, powerful and well-controlled plasma sources used in industrial technologies. In surface coating technology its principal application is in the field of thermal spray by injection of solid particles (Plasma Spaying).

A great variety of plasma spraying apparatuses for coating a surface of a workpiece with a spray powder are well known in the prior art, and are used widely in completely different technical fields. Known plasma spraying apparatuses often comprise a plasma spray gun, a high power direct-current source, a cooling aggregate and also a conveyer for conveying a substance to be sprayed into the plasma flame of the plasma spraying gun. Regarding classical powder spraying techniques, the substance to be sprayed is of course a spraying powder.

In atmospheric plasma spraying, an arc is triggered in a plasma torch between a water-cooled anode and a likewise water-cooled tungsten cathode. A process gas, usually argon, nitrogen or helium or a mixture of an inert gas with nitrogen or hydrogen, is converted into the plasma state in the arc and a plasma beam with a temperature of up to 20.000 K develops. Particle speeds of 200 to 800 m/s are achieved through the thermal expansion of the gases. The substance to be sprayed enters the plasma beam with the help of a conveyer gas either axially or radially inside or outside of the anode region.

New processes based on successful elements from the known plasma spray technology are currently more and more investigated in order to open new markets for advanced surface treatment. One of the routes is to use liquid or gaseous precursors (instead of solids) to allow thin film deposition by vaporizing and dissociating the precursors (Chemical Vapor Deposition, CVD).

US 2003/0077398 describes a method for using nanoparticle suspensions in conventional thermal spray deposition for the fabrication of nanostructured coatings. This method has the disadvantage that ultrasound must be used for dispersing the nanoparticles in a liquid medium before the injection into a plasma gas stream.

WO 2006/043006 discloses a method for coating a surface with nanoparticles as well as a device for carrying out this method, wherein the method is characterized in that it involves an injection of a colloidal sol of these nanoparticles into a plasma jet outside of the plasma torch.

U.S. Pat. No. 6,447,848 discloses a modified Metco 9 MB-plasma torch, wherein the powder injection port has been removed and replaced by a multiple injection nozzle for injecting different liquid precursors and slurries at the same time into the plasma flame. That is, the liquid precursor is also fed outside of the plasma torch into the plasma gas stream.

In particular, the injection of liquids in plasma jets is a complex task which notably differs from the injection of gas-carried solid particles as used in the above-described well-developed plasma powder spraying technologies. Therefore this involves specific developments by adapting the plasma torch operation parameters.

One major problem is that by the injection of liquids in a plasma nozzle of regular geometry known from the prior art, it is difficult to obtain a quasi-homogeneous distribution of the liquid and/or pressure in the plasma gas stream. The liquid cannot penetrate enough in the plasma gas stream and can freeze by the expansion on leaving a respective introducing duct through which the liquid is introduced into the plasma gas stream.

That is, the spontaneous vaporization of the liquid at low pressure and the consecutive release of the latent heat often lead to a freezing of the remaining fluid at the exit of the introducing duct using plasma spraying devices known from the prior art.

Another major problem is due to the supersonic nature of the plasma jet flow, with surrounding barrel shocks or compression waves which scatter the injected liquid jet or spray and hamper its penetration inside the jet core. This disqualifies the injection of liquids outside the plasma torch nozzle (under normal pressure) for most of the operating pressure foreseen for thermal plasma CVD (below 100 mbar).

On the other hand, the momentum of the injected liquid jet has to be high enough or the injection pipe should penetrate the plasma jet beyond the barrel shocks to avoid scattering. This requires either a high injection velocity, or results in excessive heat load onto the introducing duct. Due to all these limitations and complications, the injection of the liquid outside of the torch nozzle known from the prior art has turned out to be inappropriate to achieve a sufficient penetration of the liquid into the plasma gas stream.

However, an injection of the fluid inside the plasma torch has not been considered so far due to the difficulties arising from the design of known plasma spraying guns, in particular due to the complex cooling system including the water-cooled anode and cathode as mentioned above.

SUMMARY OF THE INVENTION

It is thus an object of the present invention to make available an improved plasma spraying device avoiding the disadvantages known from the prior art and allowing to penetrate a liquid precursor (that is, a spraying or a coating fluid) deeply, and more or less completely, into a plasma gas stream of a plasma torch. It is also an object of the invention to provide a respective new and improved method for introducing a liquid precursor which is a spraying or a coating fluid into a plasma gas stream.

The subject matters of the invention satisfy these objects with particularly advantageous embodiments of the invention.

The invention thus relates to a plasma spraying device for spraying a coating onto a substrate by a thermal spray process. The plasma spraying device includes a plasma torch for heating up a plasma gas in a heating zone, wherein the plasma torch includes a nozzle body for forming a plasma gas stream, and the plasma torch has an aperture running along a central longitudinal axis through the nozzle body. The aperture has an convergent section with an inlet for the plasma gas, a throat section including a minimum cross-sectional area of the aperture, and a divergent section with an outlet for the plasma gas stream, wherein an introducing duct is provided for introducing a liquid precursor into the plasma gas stream. According to the invention a penetration means is provided to penetrate the liquid precursor inside the plasma gas stream.

Thus, it is essential for the invention that a penetration means is provided allowing a deep and essentially complete penetration of the liquid precursor inside the plasma gas stream.

Before turning to special embodiments of the invention, some general considerations and facts related to the present invention will be presented.

In the following, various routes in accordance with the present invention to achieve injection of liquid precursors into the plasma jet are presented. The plasma spray torch used for the investigations is for example an F4-VB plasma gun operated under reduced pressure (1-100 mbar). The methods can also be extended to other plasma guns, and are also applicable to higher process chamber pressure.

The plasma gun used is as mentioned for example an F4-VB (provided by Sulzer Metco) operated with argon flows between 30 and 60 SLPM and currents in the range of 300-700 A, at a chamber pressure between 0.1-1000 mbar. However, depending, for example, on the liquid precursor, the type of plasma gun, the coating to be sprayed and so on, other spraying parameters may be more suitable than the aforementioned special parameters.

Two different ways of injecting the liquid in the plasma jet have been investigated: direct injection and nebulizing of the liquid precursor (injection of a liquid spray with a carrier gas).

The test liquid was for example deionized water. It has been found that there are essentially two main physical limitations to the injection of liquids in a plasma jet at reduced pressure:

the first being spontaneous vaporization of the liquid at low pressure and the consecutive release of the latent heat which leads to freezing of the remaining fluid at the exit of the injection pipe or capillary; and the second being the supersonic nature of the plasma jet flow, with surrounding barrel shocks or compression waves which scatter the injected liquid jet or spray and hamper its penetration inside the jet core.

Therefore, it is an important insight of the present invention that the local pressure at the injection location has to be sufficiently high to avoid spontaneous evaporation, which disqualifies the injection of liquids outside the plasma torch nozzle for most of the operating pressure foreseen for thermal plasma CVD (for example below 100 mbar). On the other hand, the momentum of the injected liquid jet has to be high enough or the injection pipe should penetrate the plasma jet beyond the barrel shocks to avoid scattering. This requires either a high injection velocity, and/or results in excessive heat load onto the injection pipe or nebulizer. All these limitations and complications can be avoided by the present invention by injecting the liquid precursor inside the torch nozzle, which has also the advantage of being more practical for further integration into an industrial process.

Regarding the nozzle design, most of the torch nozzles used for low pressure plasma spraying are of "convergent-divergent" type (also called "Laval" nozzles). If the pressure chamber is sufficiently low, the plasma flow is accelerated in the convergent part until it reaches M=1 (sonic flow). If the nozzle does not expand downstream, then the gas velocity cannot exceed M=1 (chocked flow), and the maximum mass flow is limited. If supersonic velocities are wanted, or if the pressure at the exit of the nozzle is low, a subsequent increase of the nozzle cross-section (divergent) is required. This allows the flow to further accelerate to supersonic velocities, and the static pressure to progressively drop and eventually reach the chamber pressure at the exit ("matched flow"). That is why the convergent-divergent nozzles have to be used at low pressure.

The pressure is the highest in the convergent part of the nozzle but it is difficult to access for liquid injection due to the torch water cooling channels and the proximity of the arc root anodic attachment. Since the pressure is decreasing in the divergent section of the nozzle, the optimum location for liquid injection is at the end of the cylindrical part (throat). All standard F4-VPS nozzles used for low pressure plasma spraying exhibit a pressure at the throat which does not exceed 200 mbar, for all the relevant process chamber pressures. Note that when the flow is supersonic in the divergent, the pressure at the throat is not influenced by the process chamber pressure. Moreover, the torch operation parameters, such as current and gas flow, only weakly affect the pressure at the throat. Therefore, in accordance with the present invention, to increase the pressure at the liquid injection location is to act on the nozzle shape and dimension.

Special nozzles have been designed which allow increasing the pressure at the throat. The basic principle is to increase the length of the divergent section. An optimum pressure at the throat between 300 and 650 mbar (depending on the torch current and gas flow) can be obtained for a nozzle with 6 mm cylindrical diameter expanding to 10 mm diameter at the exit, over a length of 25 mm. Note that the throat pressure increases slightly with increasing torch current, and can be nearly doubled if the torch gas flow is increased from 30 to 60 SLPM argon. A side effect of this design is an increase of the exit pressure, which leads to an under-expanded flow at a higher chamber pressure than for "short" standard nozzles. But this point should only be taken into account if it is required to match the plasma flow pressure to the process chamber pressure for particular applications.

In the case of near-atmospheric or high pressure operation the pressure inside the nozzle remains relatively high, which does not lead to spontaneous vaporization of the injected liquid. Hence, in this case it is not required to develop special nozzles.

Summarizing the discussion, to avoid spontaneous evaporation and subsequent freezing of the liquid, the pressure at the injection location should preferably be higher than the spontaneous vaporization pressure. According to the present invention, this can be achieved by positioning the injection location at the nozzle throat and/or by a specific design of the nozzle shape to increase the throat pressure. This could be successfully demonstrated with an F4-VB gun.

According to the present invention, there are other possible routes to favor the injection of the liquid by a special nozzle design. One is to induce attached oblique shocks in the divergent part of the nozzle. These shocks lead to a local increase of the pressure. This could be achieved by making a discontinuity at the surface of the nozzle wall (like a groove or a step). Another idea is to insert a second convergent section downstream of the divergent to increase the pressure and eventually decelerate the flow to subsonic speed through a normal shock.

In a special embodiment of the present invention, the liquid precursor is directly introduced into the plasma gas stream. The injection of liquid is made with a specially designed distribution system, comprising a pressurized reservoir, a mass flow meter, a needle valve to adjust the liquid flow and various purges.

Once the local pressure at the injection location has been increased by a proper nozzle design in accordance with the present invention, the liquid can be directly injected through one or several introducing ducts, which are preferably designed as small orifices on the nozzle wall. However, to allow the liquid to penetrate deeply and to be stable inside the jet there are some constraints.

The injected liquid should transit through the plasma flow boundary layer. If its velocity at injection is too small, it will not penetrate and form a droplet at the inner nozzle wall. This droplet will eventually be entrained by the plasma flow and will flow off towards the nozzle exit without penetrating the jet. Depending on the surface tension of the injected liquid, this phenomenon can occur in an intermittent manner, where a droplet is formed at the injection hole and grows until it is swept away by the plasma flow, leading to instability of the plasma jet. Furthermore, the penetration of the liquid inside the plasma jet is not optimum in that case.

Since for most applications the mass flow of injected liquid will be low (several 10's of g/h), it is not possible to increase the velocity at injection by increasing the liquid flow. A possible route is to reduce the diameter of the injection hole (use of capillary). But this requires a high liquid pressure and is not applicable for high viscosity liquids or slurries. Injection of water through a capillary of about 100 micron diameter at water flows down to 50 g/h has been successfully tested on an F4-VB gun with a modified nozzle.

Another way to allow the liquid to penetrate the plasma jet is to induce turbulence at the plasma flow boundary layer. This could be achieved by matching one or several grooves at the nozzle wall surface, coaxially to the nozzle axis.

This method is more efficient if the grooves are made at the liquid injection location and possibly also downstream. The groove at injection location allows the liquid to be azimuthally distributed and to smoothly penetrate the plasma jet. A groove downstream of the injection location will prevent the liquid from flowing out of the torch nozzle by recuperating. These designs have also been successfully demonstrated on a modified F4 nozzle. Note that this approach is more suitable for intermediate to high liquid flows (100-500 g/h eq. water). The depth of the groove has to be sufficient (more than 0.5 mm for water) and might have to be even deeper for higher surface tension liquids.

Regarding another embodiment of the present invention, a nebulizer is used to allow the liquid to penetrate the plasma jet. It has the advantage that the liquid, that is, the liquid precursor, can be injected at high velocity in the form of a mist. The liquid is atomized, which helps the vaporization inside the plasma jet. Another advantage is that this allows the injection of a very small amount of liquid deep inside the plasma jet due to the high droplet velocity.

A "flow focusing concentric nebulizer" (PFA-ST, from Elemental scientific, external diameter at the tip of the nebulizer is for example around 2 mm) has been successfully tested. The liquid is fed into the nebulizer and the gas stream flow of argon is controlled with a mass flow meter in the range of 0.1-1 SLPM.

This nebulizer can be made of PFA (fluoropolymer) or can be made of other heat resistant material and can operate at temperatures up to at least 180° C. The full angle of the spray at exit is about 30° and the droplet size can be as small as 6 micrometers with an exit velocity up to 40 m/s depending on the carrier gas flow rate. With an argon gas flow up to 1 SLMP, the spray is stable and uniform for water flows between 20 and 500 g/h. An F4 torch nozzle has been modified to be equipped with the nebulizer, and water spray has been successfully injected in the plasma jet. Note that it is mandatory that the pressure inside the torch nozzle at the injection location is for example higher than 400 mbar to avoid freezing of the water at the exit of the nebulizer. This has also been done with a "long" nozzle as in the direct liquid injection described above. The use of a nebulizer is possible for the injection of slurries or suspensions, provided that the suspended particles are substantially smaller than the diameter of the capillary (100 microns). The material (PFA) is chemically resistant to most of the acids, alkalis, organics and salt solutions.

Regarding a special embodiment of the present invention, the introducing duct is provided between the convergent section and the divergent section of the aperture, in particular at the minimum cross-sectional area of the aperture and/or wherein the introducing duct is provided between the inlet of the convergent section and the minimum cross-sectional area of the aperture and/or wherein the introducing duct is provided between the minimum cross-sectional area of the aperture and the outlet of the divergent section.

The exact location of the introducing duct may depend on the liquid precursor (suspension, slurry or a fluid not comprising solid particles), and/or the coating to be sprayed and/or the special design of the plasma spraying device to be used.

In a special embodiment which is very important in practice, the penetration means is a penetration groove, being provided at an inner wall of the nozzle body, in particular a circumferential penetration groove, and/or the penetration groove is provided between the convergent section and the divergent section of the aperture, in particular at the minimum cross-sectional area of the aperture and/or wherein the penetration groove is provided between the inlet of the convergent section and the minimum cross-sectional area of the aperture and/or wherein the penetration groove is provided between the minimum cross-sectional area of the aperture and the outlet of the divergent section. The penetration groove creates strong turbulence resulting in a quasi-homogenous mixing of the liquid precursor in the plasma stream.

Preferably but not necessarily, the penetration grove has a triangular shape and/or has a width of 0.5 mm to 3 mm, in particular between 1 mm and 2 mm, especially 1.5 mm, and/or has a depth of 0.05 mm to 2 mm, in particular between 0.75 mm and 1.5 mm, preferably 1 mm.

A special advantage of using a penetration groove is that suspension or slurries comprising comparatively large particles can be used as a liquid precursor, because there is no introducing duct of a small diameter; that is, no capillary passage is required to penetrate the liquid precursor deep into the plasma gas stream.

In a further very important embodiment in accordance with the present invention, the penetration means is provided by the introducing duct being designed as a nebulizer, wherein the nebulizer is provided between the convergent section and the divergent section of the aperture, in particular at the minimum cross-sectional area of the aperture, and/or wherein the nebulizer is provided between the inlet of the convergent section and the minimum cross-sectional area of the aperture and/or wherein the nebulizer is provided between the minimum cross-sectional area of the aperture and the outlet of the divergent section.

In case of a very fine liquid precursor injection stream and/or when the liquid precursor has to be introduced under increased pressure, penetration is provided by the introducing duct being designed as a capillary having an injection hole with reduced diameter.

According to a special embodiment of the present invention, the capillary is provided between the convergent section and the divergent section of the aperture, in particular at the minimum cross-sectional area of the aperture, and/or wherein the capillary is provided between the inlet of the convergent section and the minimum cross-sectional area of the aperture and/or wherein the capillary is provided between the minimum cross-sectional area of the aperture and the outlet of the divergent section.

Preferably, to enable the liquid precursor optimally into the plasma gas stream, an introducing angle of the introducing duct is between 20° and 150°, in particular between 45° and 135°, preferably between 70° and 110°, especially about 90°.

Thereby, the introducing duct and/or the penetration means, in particular the nebulizer, is made of PFA and/or of another suitable material, in particular depending on the liquid precursor to be used.

To supply and meter the liquid precursor, a supply unit is provided to supply the liquid precursor, wherein the supply unit includes a reservoir for the liquid precursor and/or a reservoir for a carrier gas and/or a reservoir pressurization for pressurizing the liquid precursor by the carrier gas and/or a metering device, in particular a liquid and/or gas flow meter, especially a mass flow meter, for metering the flow of the liquid precursor and/or the carrier gas.

As already mentioned, the liquid precursor can be a slurry, and/or a suspension, and/or the liquid precursor is water, and/or an acid, and/or an alkali fluid, and/or an organic fluid, in particular methanol, and/or an salt solution, and/or organosilicon and/or another liquid precursor, and/or the liquid precursor is a suspension or a slurry, in particular a coating fluid comprising nanoparticles and/or a solution or mixing of the aforementioned liquid precursors.

The invention relates also to a method for introducing a liquid precursor into a plasma gas stream using a plasma spraying device and comprising the following steps: providing a plasma spraying device, which includes a plasma torch, with a nozzle body, wherein the plasma torch has an aperture running along a central longitudinal axis through the nozzle body. The aperture has a convergent section with an inlet for the plasma gas, a throat section including a minimum cross-sectional area of the aperture, and a divergent section with an outlet for the plasma gas, wherein an introducing duct is provided for introducing a liquid precursor into a plasma gas stream. A plasma gas is introduced into the inlet of the convergent section of the aperture, and the plasma gas is fed through the convergent section, the throat section, and the divergent section to the outlet of the divergent section. A plasma flame is ignited and established inside the plasma torch in a heating zone, for heating up the plasma gas and forming the plasma gas stream, and a surface of a substrate is coated by feeding the plasma gas stream via the outlet of the diverging section of the aperture onto the surface of the substrate. In accordance with the method of the present invention, a penetration means is provided and the liquid precursor is penetrated through the introducing duct inside the plasma gas stream with the aid of the penetration means.

Regarding a special embodiment of the present invention, the introducing duct is provided between the convergent section and the divergent section of the aperture, in particular at the minimum cross-sectional area of the aperture, and/or the introducing duct is provided between the inlet of the convergent section and the minimum cross-sectional area of the aperture and/or the introducing duct is provided between the minimum cross-sectional area of the aperture and the outlet of the divergent section.

In an embodiment which is very useful in practice, a penetration groove is provided at an inner wall of the nozzle body, and is in particular a circumferential penetration groove.

The penetration groove may be provided between the convergent section and the divergent section of the aperture, in particular at the minimum cross-sectional area of the aperture, and/or the penetration groove is provided between the inlet of the convergent section and the minimum cross-sectional area of the aperture and/or the penetration groove is provided between the minimum cross-sectional area of the aperture and the outlet of the divergent section. In an important embodiment, the penetration groove is located close and downstream with respect to the introducing duct.

In some embodiments, the penetration grove has a triangular shape and/or has preferably a width of 0.5 mm to 3 mm, in particular between 1 mm and 2 mm, especially 1.5 mm, and/or has a depth of 0.05 mm to 2 mm, in particular between 1 mm and 1.5 mm. The aforementioned dimensions of the penetration groove in accordance with the present invention may vary and can be different from the above-mentioned values, depending on the spraying gun, and/or the nature of the liquid precursor and/or depending on further parameters or demands on the respective spraying process.

Regarding a further special embodiment of the present invention, which is also very important in practice, the penetration means is provided by the introducing duct, which introducing duct itself is designed as a nebulizer. That is, the liquid precursor is introduced in the form of a mist into the plasma gas stream.

Preferably, the nebulizer is provided between the convergent section and the divergent section of the aperture, in particular at the minimum cross-sectional area of the aperture, and/or the nebulizer is provided between the inlet of the convergent section and the minimum cross-sectional area of the aperture and/or wherein the nebulizer is provided between the minimum cross-sectional area of the aperture and the outlet of the divergent section.

In a further important embodiment, the penetration means is provided by the introducing duct being designed as a capillary which has an injection hole with reduced diameter.

The capillary can be provided between the convergent section and the divergent section of the aperture, in particular at the minimum cross-sectional area of the aperture, and/or the capillary may be provided between the inlet of the convergent section and the minimum cross-sectional area of the aperture and/or the capillary is provided between the minimum cross-sectional area of the aperture and the outlet of the divergent section.

Preferably, the liquid precursor is introduced with respect to the longitudinal axis of the aperture at an introducing angle between 20° and 150°, in particular between 45° and 135°, preferably between 70° and 110°, especially at an angle of about 90°.

As a liquid precursor, quiet different fluids and mixtures of fluids and/or mixtures of fluids and solid particles can be used. Preferably, the liquid precursor is a slurry, and/or a suspension, and/or the fluid is water, and/or an acid, and/or an alkali fluid, and/or an organic fluid, in particular methanol, and/or a salt solution, and/or another coating fluid, and/or the liquid precursor is a suspension or a slurry, in particular a coating fluid comprising nanoparticles and/or a solution or mixing of the aforementioned liquid precursor.

Moreover, the invention relates to the use of a plasma spraying device and/or a plasma spraying method in accordance with the present invention for coating a surface of a substrate or a device, in particular a surface of a photovoltaic device, especially a solar cell, and/or for providing a coating, in particular a functional coating on a substrate, in particular on a glass substrate or on a semiconductor, especially on a silicon substrate, in more particular on a wafer comprising electronic elements and/or for providing a carbon coating, in particular a Diamond Like Carbon (DLC) coating and/or a carbide coating and/or a nitrides coating and/or a composite coating and/or a nanostructured coating and/or a functional coating on textiles.

A person skilled in the art would understand that the above-discussed special embodiments according to the invention are only examples and that, in special cases, the described special embodiments can be combined in every suitable manner. Depending on the demands in special cases, a plasma spraying device in accordance with the invention may include different introducing ducts and/or different penetration means; that is, a plasma spraying device can include a penetration and/or a nebulizer and/or a capillary in parallel so that, for example, different liquid precursors can be fed simultaneously and/or subsequently fed into the plasma gas stream allowing the generation of complex coatings on a great variety of different substrates.

In the following, the invention is described in more detail with reference to the schematic drawing.

DESCRIPTION OF THE PREFERRED EMBODIMENTS

Figure 1:
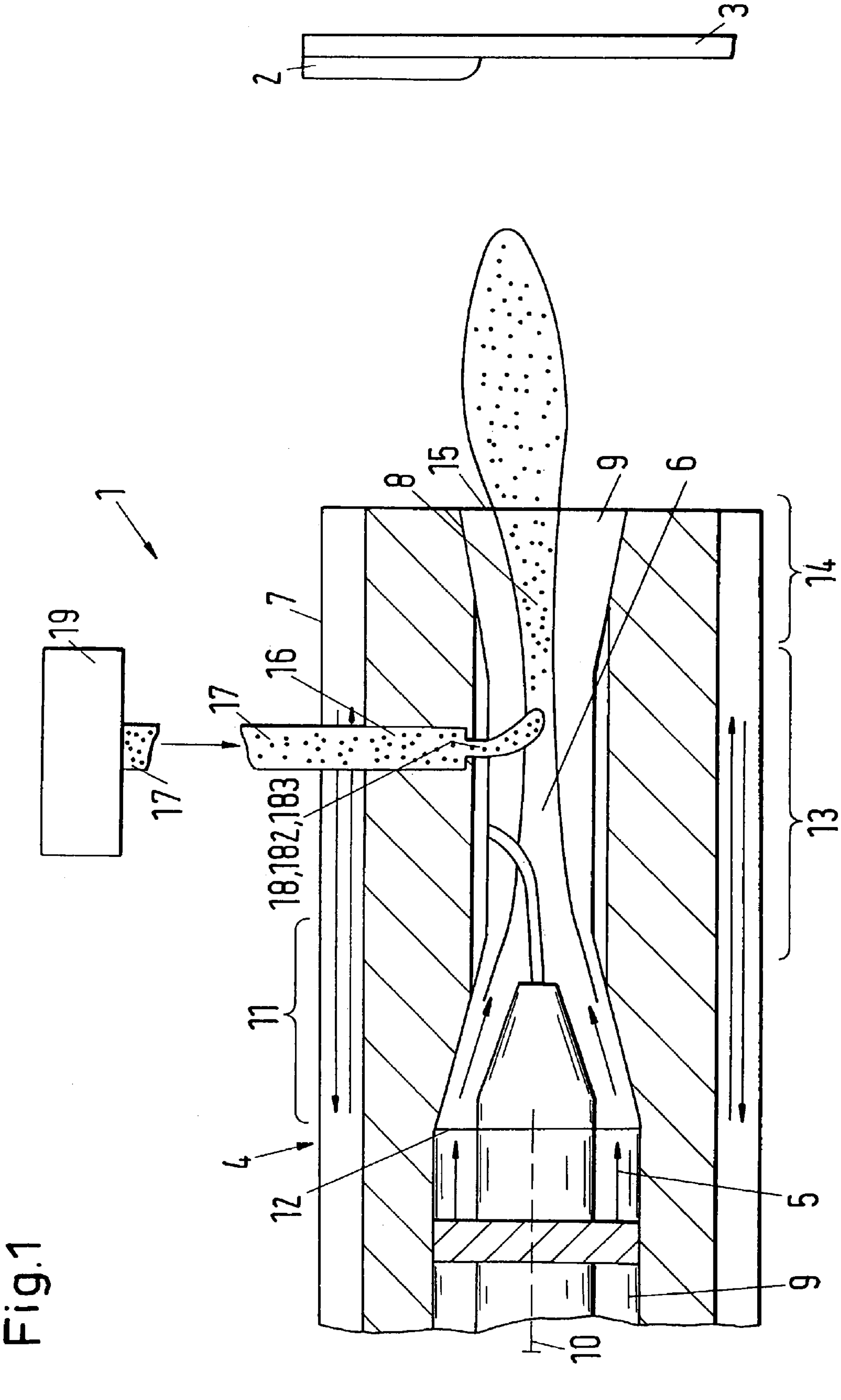
FIG. 1 is a plasma spraying device in accordance with the invention.

In FIG. 1, a plasma spraying device in accordance with the invention is schematically displayed, which plasma spraying device is designated overall in the following by the reference numeral 1. Note that the same reference numerals in different figures designate the same technical features.

The plasma spraying device according to FIG. 1 includes a plasma torch 4 for heating up a plasma gas 5 in a heating zone 6. The plasma torch 4 has a nozzle body 7 for forming a plasma gas stream 8. An aperture 9 runs along a central longitudinal axis 10 through the nozzle body 7, which aperture 9 has a convergent section 11 with an inlet 12 for the plasma gas 5, a throat section 13 including a minimum cross-sectional area of the aperture, and a divergent section 14 with an outlet 15 for the plasma gas stream 8. An introducing duct 16 is provided for introducing a liquid precursor 17, provided by a supply unit 19, into the plasma gas stream 8. In accordance with the present invention, a penetration means 18 is also provided to penetrate the liquid precursor 17 inside the plasma gas stream 8, which is directed to a surface of a substrate 3 for spraying a coating 2 onto the substrate 3.

In the special example of FIG. 1, the introducing duct 16 is provided between the convergent section 11 and the divergent section 14 of the aperture 9 at the minimum cross-sectional area of the aperture 9. It is understood that in another special embodiment the introducing duct 16 can be provided between the inlet 12 of the convergent section 11 and the minimum cross-sectional area of the aperture 9, and/or the introducing duct 16 is provided between the minimum cross-sectional area of the aperture 9 and the outlet 15 of the divergent section 14.

Figure 2:
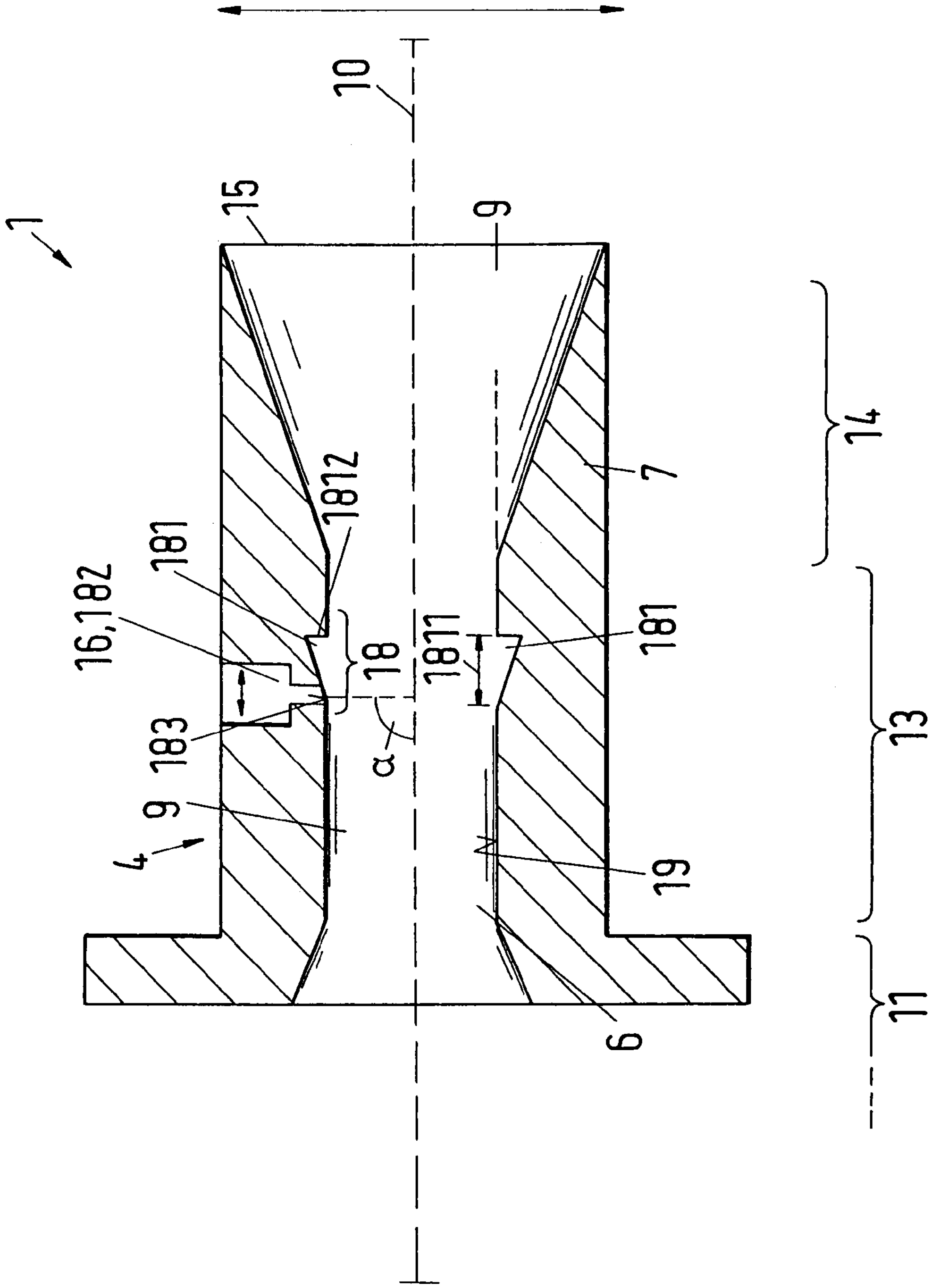
FIG. 2 is a plasma torch with a penetration groove.

FIG. 2 shows a second embodiment of the present invention wherein the plasma torch 4 includes a penetration groove 181. The penetration groove 18, 181, being provided at an inner wall 19 of the nozzle body 7, is in particular a circumferential penetration groove 181. The introducing duct 16 is provided between the convergent section 11 and the divergent section 14 of the aperture 9 at the minimum cross-sectional area of the aperture 9 close to the penetration groove 181.

The penetration grove 181 has a triangular shape and has a width 1811 of for example 0.5 mm to 3 mm, in particular between 1 mm and 2 mm, especially 1.5 mm, and has a depth 1812 of 0.05 mm to 2 mm, in particular between 0.75 mm and 1.5 mm, preferably 1 mm.

The introducing duct 16 in the example of FIG. 2 includes at the same time a penetration means 18, which is a penetration groove 181 and a capillary 182.

That is, in addition to the penetration groove 181, the penetration means 18 is provided by the introducing duct 16 being designed as the capillary 182 having an injection hole 183 with reduced diameter, wherein the capillary 182 is provided between the convergent section 11 and the divergent section 14 of the aperture 9, in particular at the minimum cross-sectional area of the aperture 9 close to the penetration groove 181, which is placed downstream with respect to the capillary 182. In the present example, the introducing angle $\alpha$ of the introducing duct 16 is about 90°.

Figure 3:
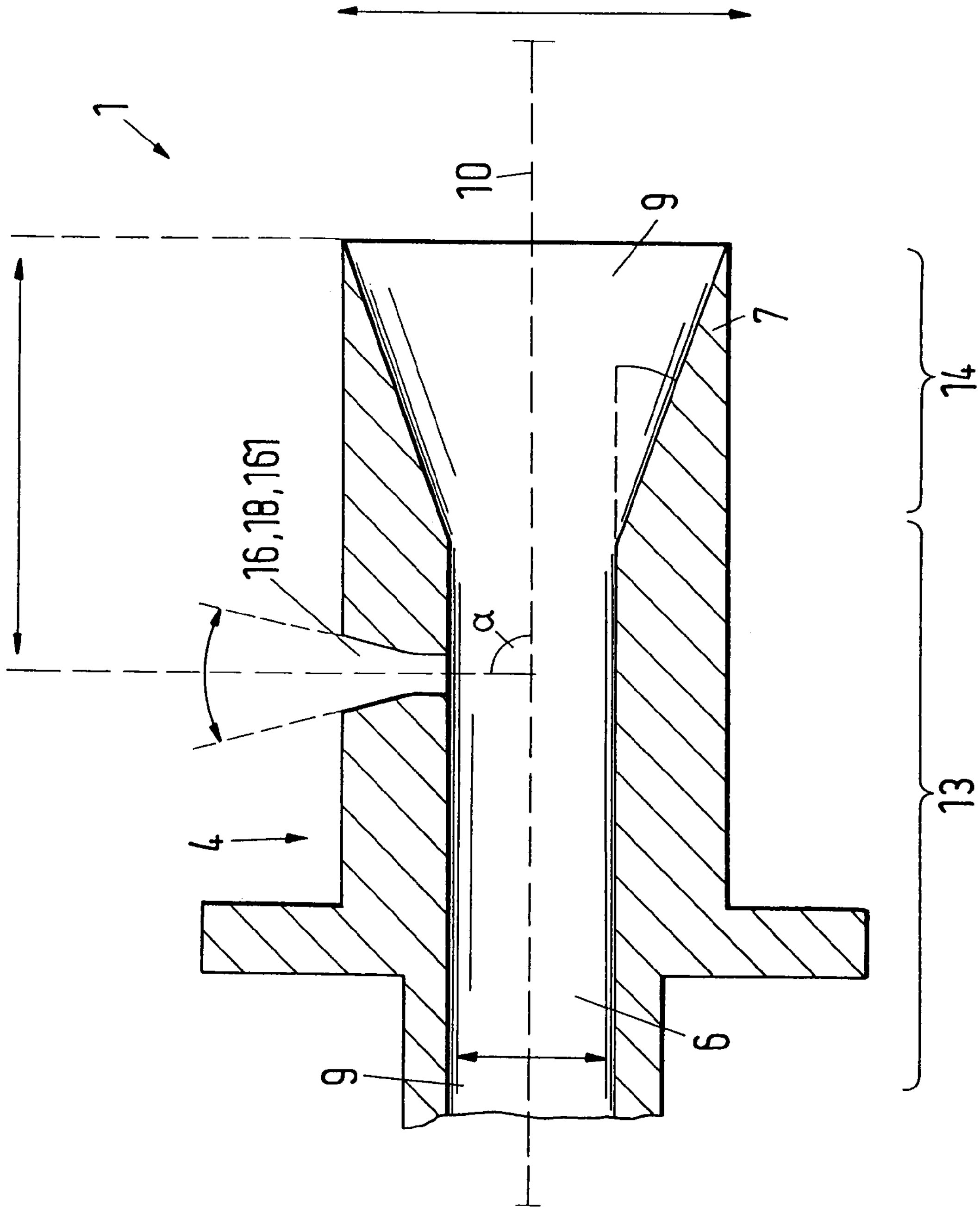
FIG. 3 is a plasma torch with a nebulizer.

Regarding FIG. 3, a plasma torch 4 with a nebulizer 161 is displayed as a further very important embodiment of the present invention.

In this example the penetration means 18 is provided by the introducing duct 16 being designed as a nebulizer 161, wherein no penetration groove is provided. It should be understood that in other embodiments a nebulizer 161 can be advantageously combined with a penetration groove 181 and/or with a capillary 182.

According to FIG. 3 the nebulizer 161 is provided between the convergent section 11 and the divergent section 14 of the aperture 9, in particular at the minimum cross-sectional area of the aperture 9, and is arranged under an introducing angle $\alpha$ of about 90° with respect to the central longitudinal axis 10.

The present invention demonstrates for the first time the possibility of injecting liquids inside the nozzle of a plasma torch, either directly or using a nebulizer. Both methods require a special design of the torch nozzle to obtain a pressure sufficiently high at the injection point to avoid solidification of the liquid. For direct injection, a high velocity of the fluid is necessary to penetrate through the plasma flow boundary layer. This is achieved using a very small diameter injection hole (capillary), but is in most cases not advantageously applicable for highly viscous liquids or slurries. If a larger diameter of the injection hole is used which leads to a low injection velocity, mixing of the liquid with the plasma jet can strongly be improved by the penetration grooves, which induce turbulence in the boundary layer and distribute the liquid azimuthally.

The invention claimed is:

1. Plasma spraying device for spraying a coating onto a substrate by a thermal spray process, said plasma spraying device comprising:

a plasma torch for heating up a plasma gas in a heating zone, wherein the plasma torch includes a nozzle body for forming a plasma gas stream, said plasma torch having an aperture running along a central longitudinal axis through said nozzle body, which aperture has a convergent section with an inlet for the plasma gas, a throat section including a minimum cross-sectional area of the aperture, and a divergent section with an outlet for the plasma gas stream, wherein an introducing duct is provided for introducing a liquid precursor into the plasma gas stream, wherein a penetration groove is provided in order to penetrate the liquid precursor inside the plasma gas stream, wherein the penetration groove comprises a triangular shape, wherein the penetration groove includes a step arranged to produce strong turbulences in the plasma gas stream downstream of the introducing duct.

2. Plasma spraying device in accordance with claim 1, wherein the introducing duct is provided between the convergent section and the divergent section of the aperture, or at the minimum cross-sectional area of the aperture or wherein the introducing duct is provided between the inlet of the convergent section and the minimum cross-sectional area of the aperture or wherein the introducing duct is provided between the minimum cross-sectional area of the aperture and the outlet of the divergent section.

3. Plasma spraying device in accordance with claim 1, wherein the penetration groove is provided at an inner wall of the nozzle body and is circumferentially arranged.

4. Plasma spraying device in accordance with claim 1, wherein the penetration groove is provided between the convergent section and the divergent section of the aperture, at the minimum cross-sectional area of the aperture or wherein the penetration groove is provided between the inlet of the convergent section and the minimum cross-sectional area of the aperture or wherein the penetration groove is provided between the minimum cross-sectional area of the aperture and the outlet of the divergent section.

5. Plasma spraying device in accordance with claim 1, wherein the triangular shape has a width of 0.5 mm to 3 mm, and/or has a depth of 0.05 mm to 2 mm.

6. Plasma spraying device in accordance with claim 1, wherein the penetration groove comprises a capillary having an injection hole with reduced diameter.

7. Plasma spraying device in accordance with claim 6, wherein a capillary is provided between the convergent section and the divergent section of the aperture at the minimum cross-sectional area of the aperture or wherein the capillary is provided between the inlet of the convergent section and the minimum cross-sectional area of the aperture or wherein the capillary is provided between the minimum cross-sectional area of the aperture and the outlet of the divergent section.

8. Plasma spraying device in accordance with claim 1, wherein an introducing angle of the introducing duct is between 20° and 150°.

9. Plasma spraying device in accordance with claim 1, including a supply unit to supply the liquid precursor.

10. Plasma spraying device in accordance with claim 9, wherein the supply unit includes a reservoir for the liquid precursor and/or a reservoir for a carrier gas and/or a reservoir pressurization for pressurizing the liquid precursor by the carrier gas and/or a metering device, a liquid and/or gas flow meter, or mass flow meter, for metering the flow of the liquid precursor and/or the carrier gas.

11. Plasma spraying device in accordance with claim 9, wherein the liquid precursor comprises at least one of a slurry, a suspension, fluid, water, an acid, an alkali fluid, an organic fluid, methanol, a salt solution, an organosilicon, coating fluid, or a liquid comprising nanoparticles.

12. Plasma spraying device in accordance with claim 1, wherein the penetration groove is continuous along a circumference of an inner wall of the nozzle body.

13. Plasma spraying device in accordance with claim 12, wherein the triangular shape of the penetration groove is maintained over the circumference of the inner wall.

14. Plasma spraying device in accordance with claim 13, wherein the liquid precursor is supplied by the introducing duct about a leading edge of the penetration groove.

15. Plasma spraying device in accordance with claim 1, wherein the penetration groove comprises a first surface, forming the step, and a second surface that together form the triangular shape in cross-section transverse to the central longitudinal axis.

16. Plasma spraying device in accordance with claim 15, wherein the first surface comprises a ring-shaped planar surface that is substantially perpendicular to the central longitudinal axis.

17. Plasma spraying device in accordance with claim 16, wherein the second surface comprises a conical surface that increases in diameter in the downstream direction.

* * * * *